United States Patent [19]
Rutledge et al.

[11] Patent Number: 4,503,387
[45] Date of Patent: Mar. 5, 1985

[54] A.C. TESTING OF LOGIC ARRAYS

[75] Inventors: David L. Rutledge; Barbara J. Fisher, both of Palm Bay, Fla.

[73] Assignee: Harris Corporation, Melbourne, Fla.

[21] Appl. No.: 454,533

[22] Filed: Dec. 30, 1982

[51] Int. Cl.³ ............................................. G01R 15/12
[52] U.S. Cl. ..................................... 324/73 R; 371/21; 371/25; 324/73 AT
[58] Field of Search ........... 324/73 R, 73 AT, 73 PG; 371/21, 25; 364/580

[56] References Cited

U.S. PATENT DOCUMENTS

| | | | |
|---|---|---|---|
| 4,034,290 | 7/1977 | Warren | 324/110 |
| 4,104,588 | 8/1978 | Westberry | 324/110 |
| 4,435,805 | 3/1984 | Hsieh et al. | 371/25 |
| 4,461,000 | 7/1984 | Young | 371/21 |

Primary Examiner—Michael J. Tokar
Attorney, Agent, or Firm—Barnes & Thornburg

[57] ABSTRACT

A test for the input and output circuitry of a logic array including means to disable the AND matrix and means selectively connecting the true and complement output of the input buffers directly to the output circuitry. Means are provided for activating and testing the exclusive OR in the output circuitry and selectively disable one of a combined input/output buffer pair.

13 Claims, 7 Drawing Figures

FIG.1
PRIOR ART
FIG.2
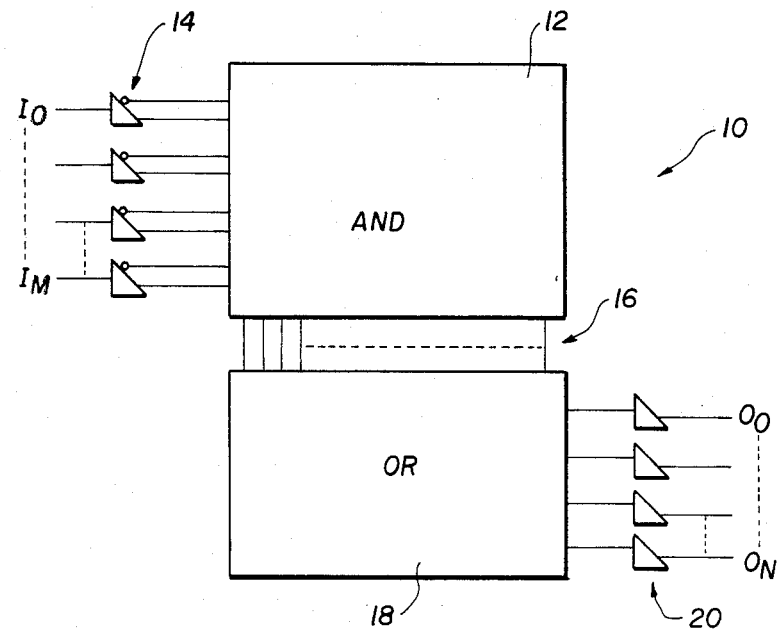
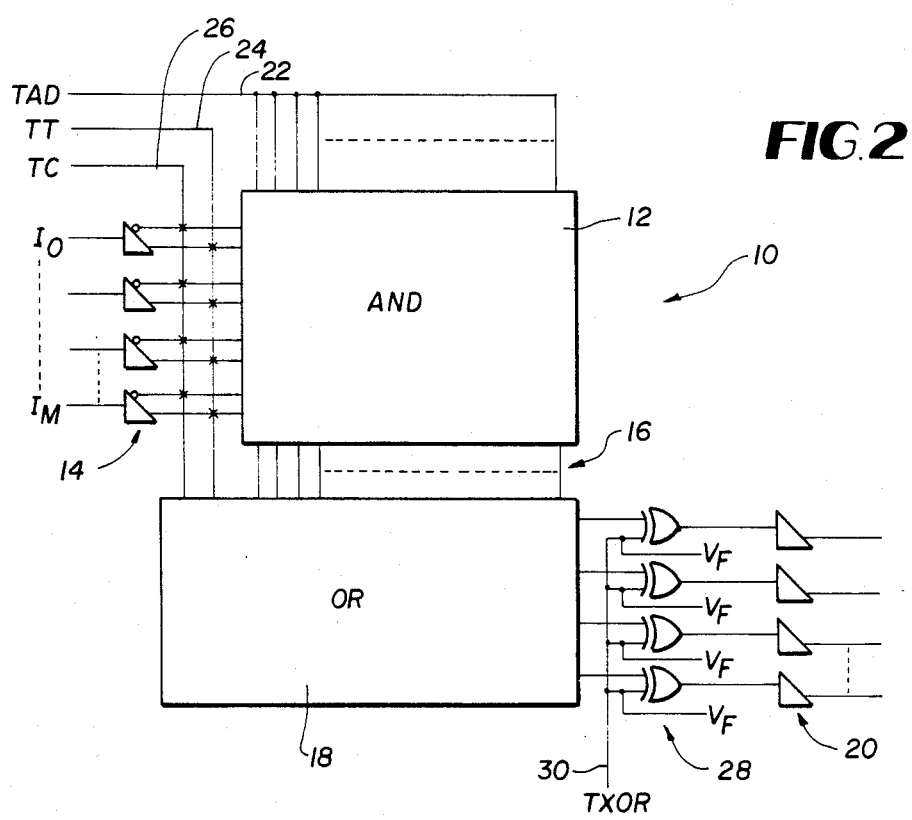

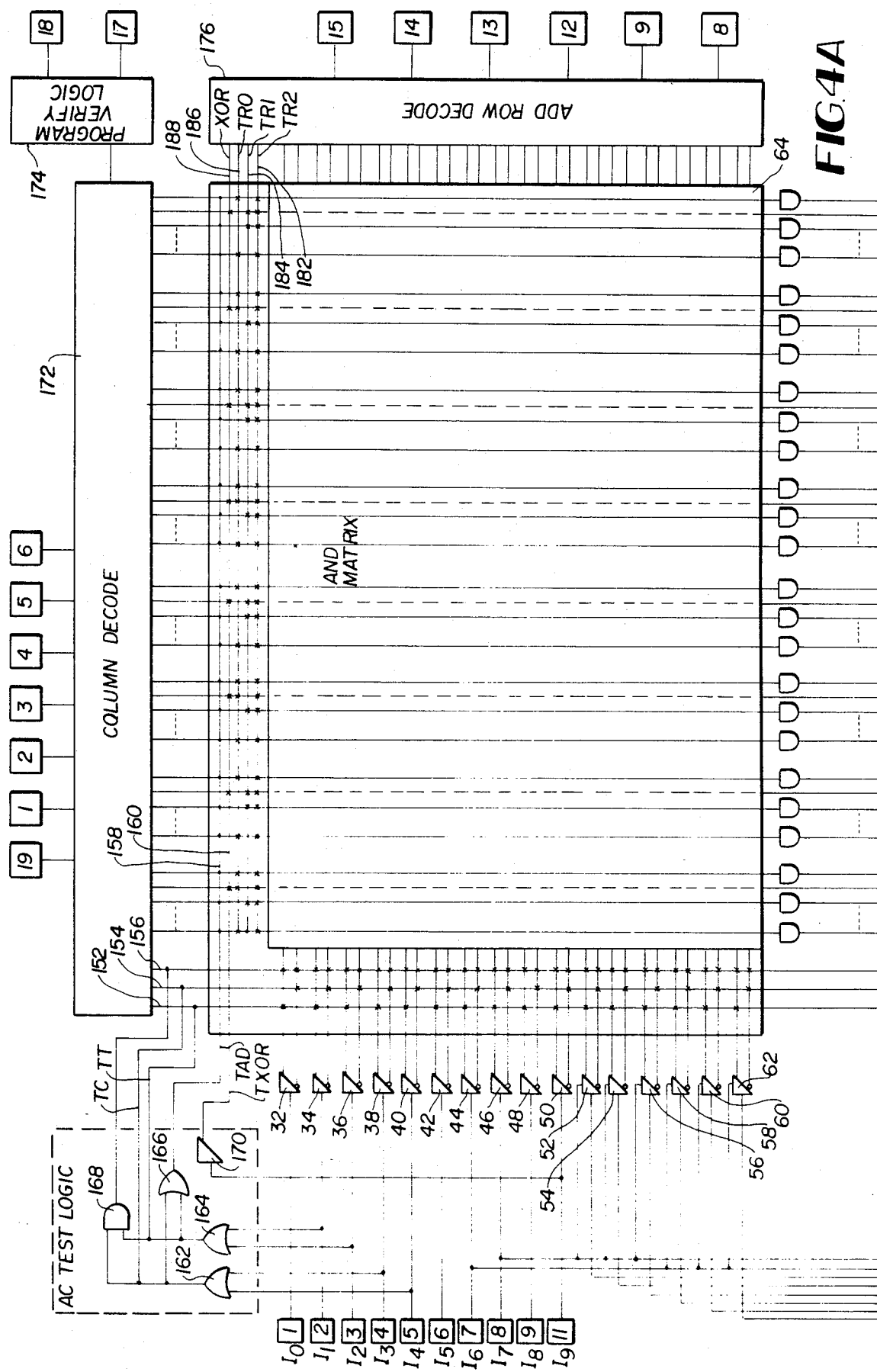

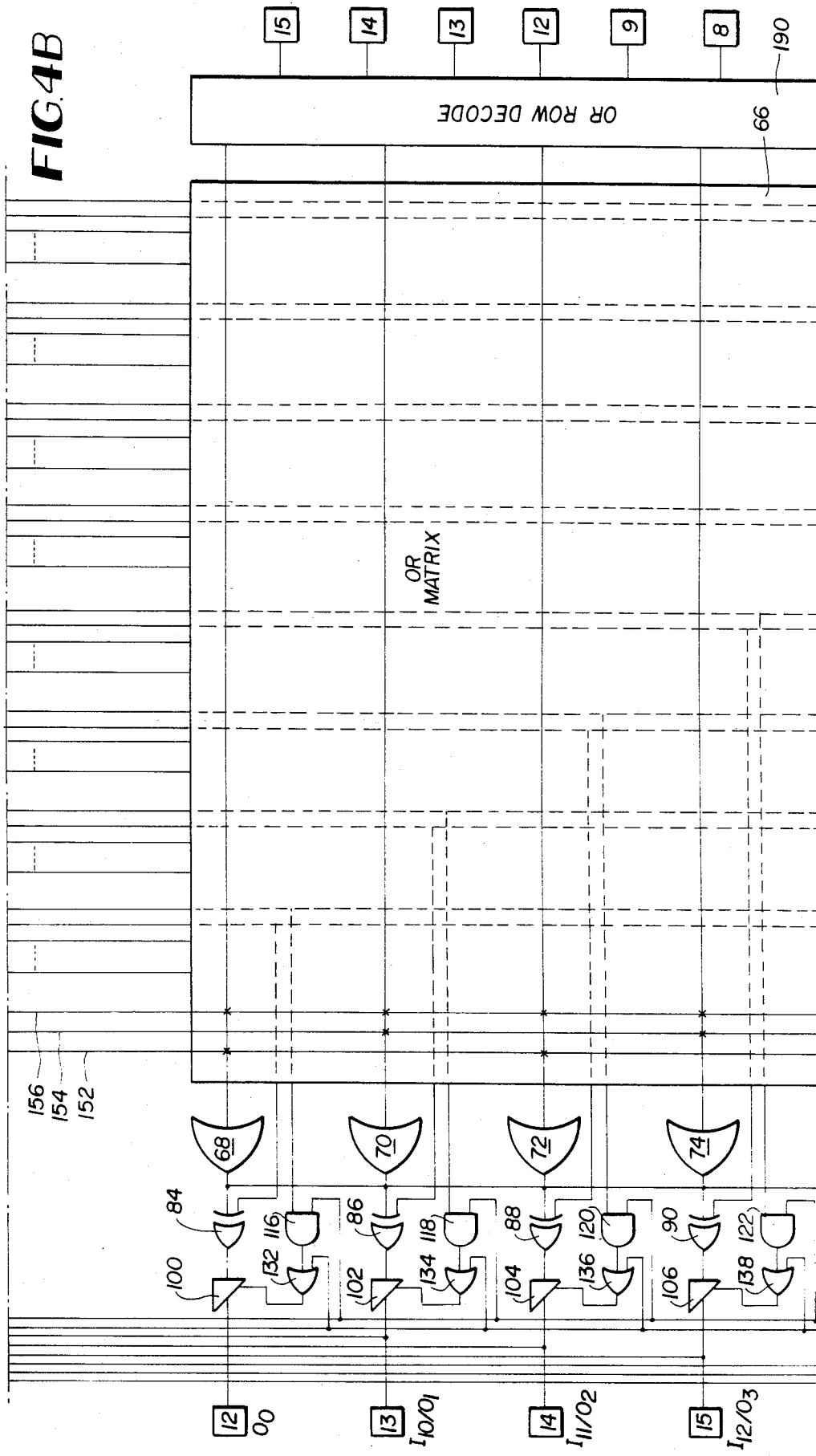

A.C. TESTING OF LOGIC ARRAYS

BACKGROUND OF THE INVENTION

The present invention relates generally to logic arrays and, more specifically, to a method of testing logic arrays including programmable type logic arrays.

A logical array in its more generic term is considered to have an logical AND matrix and a logical OR matrix. As is illustrated in FIG. 1, the inputs $I_O$ through $I_M$ are provided to input buffers 14 which provide true and complementary inputs into a logical AND matrix 12. The output of the logical AND matrix 12 at line 16 are provided as inputs to the logic OR matrix 18. The output of the logical matrix 18 are provided throughout the buffers 20 as outputs $0_O$ through $0_N$.

The most versatile logic array is known as the Programmable Logic Array (PLA). The PLA has a programmable logical AND matrix and a programmable logic OR matrix. The AND matrix produces the product terms whereas the OR matrix produces the summing terms. Thus, by programming the logical AND matrix and the logical OR matrix, specific logical equations or functions can be performed as the sum of products. It should be noted that the logical AND and the logic OR matrix are used as generic terms and may be performed in negative logic versus positive logic. Similar logical equations can be produced by PLAs as the products of sums or the inverse of product of sums. The advantage of PLAs is that by providing a programmable logical AND matrix you can create only the necessary product terms from less than all the inputs and provide an input ot the logical OR matrix. Since fewer product terms are required, the size of the logical AND matrix is reduced.

A variation of the PLA is the Programmable Read Only Memory (PROM). The PROM uses a non-programmable logical AND matrix and a programmable OR matrix. The AND matrix in a PROM provides a unique single output 16 as an input to the logical or matrix 18 as a function of all the inputs $I_O$ through $I_M$ and, thus, is a full decoder. It is distinguishable from the PLA wherein any or all of the inputs $I_O$ through $I_M$ are used to produce one or more outputs 16 from the AND matrix 12.

Another variation on the PLA is known as a Programmable Array Logic (PAL). The PAL includes a programmable logic AND matrix and a non-programmmable OR matrix. To further reduce the size of the non-programmable OR matrix, some PALs have the output of the AND matrix 16 connected to selected, prededicated OR gates.

The testing of PLAs and PALs has generally been a D.C. test or tests of the specific connections of the AND and OR matrix. Special row and column decoders have been provided for the AND and OR matrix to isolate each location in the matrix by row and column. This is needed since the input buffers may be connected to more than one column and more than one output may be produced from the AND matrix. Although this type of testing verifies the AND and OR logical matrices, they do not provide an A.C. test of the input and output circuitry. It is not a serious problem for the PROMs since for a specific combination of inputs to the AND matrix there is only one input from the AND matrix to the OR matrix. But even for this type of test, a failure during the A.C. testing of the input and output circuitry may be the result of a defect in the AND or OR matrix and, thus, it cannot be isolated to the input or output circuitry.

If the input and output circuitry were to be tested, it would have to be probe tested prior to packaging. Thus, the final packaged device would not be tested in various environments, nor could the programmed device, except for the AND and OR matrix as previously described.

Thus, there exists the need for a method and apparatus of testing logic arrays which will test the input and output circuitry independent of the AND and OR matrices.

SUMMARY OF THE INVENTION

An object of the present invention is to provide a new and improved method of testing logic arrays.

Another object of the present invention is to provide a method of testing the input and output circuitry of logical arrays.

An even further object of the present invention is to provide a test for the A.C. characteristics of the input and output circuitry of programmable arrays independent of the AND and OR matrices.

Still a further object of the present invention is to provide a test of the A.C. characteristics of the input and output circuitry of programmable arrays before and after packaging and programming.

These and other objects of the invention are obtained by disabling the AND matrices and connecting the true and complement outputs of all of the input buffers to each of the output buffers. The true or complement output of each buffer connection is activated and the individual input buffers are sequentially activated and the output is monitored. Next, the true or complementary outputs of the buffer's connection not activated in the previous operational activated and the individual input buffers are sequentially activated while the output of the output buffers are monitored. A test signal is provided at the programming input of the exclusive OR provided between the output of the OR matrix and the output buffers to test the operability of the exclusive OR and output buffer for fixed inputs on the other exclusive OR gate input which is provided from the output of the input buffers.

This test sequence is capable of being performed on a logic array by providing an additional input line parallel to the input lines from the input buffers and connected to each AND gate which is activated to a logic low to disable the AND matrix. Lines are provided parallel to the output of the AND matrix and crossing the true and complement outputs of the input buffers and are connected to the input to the output circuitry which would be the OR matrix input to an exclusive OR gate. A second line is provided connected to the control input of each of the exclusive OR gates. In logic arrays wherein some of the input to the AND matrix are fed back from the output of the OR matrix or where an output pin has a capability of being used as an input and output pin, control circuitry is provided such that either the input buffer or the output buffer of a pair is activated at one time. This allows testability of the input and the output buffer of the pair individually.

Other objects, advantages and novel features of the present invention will become apparent from the detailed description of the present invention when considered in conjunction with the accompanying drawings.

BRIEF DESCRIPTION OF THE DRAWINGS

FIG. 1 is a block diagram of a programmable logic array of the prior art.

FIG. 2 is a block diagram of a logic array incorporating the test principles of the present invention.

FIGS. 4A, 4B, and 4C are block diagrams illustrating the principles of the present invention applied to a field programmable PLA.

DESCRIPTION OF THE PREFERRED EMBODIMENTS

Figure 3A:
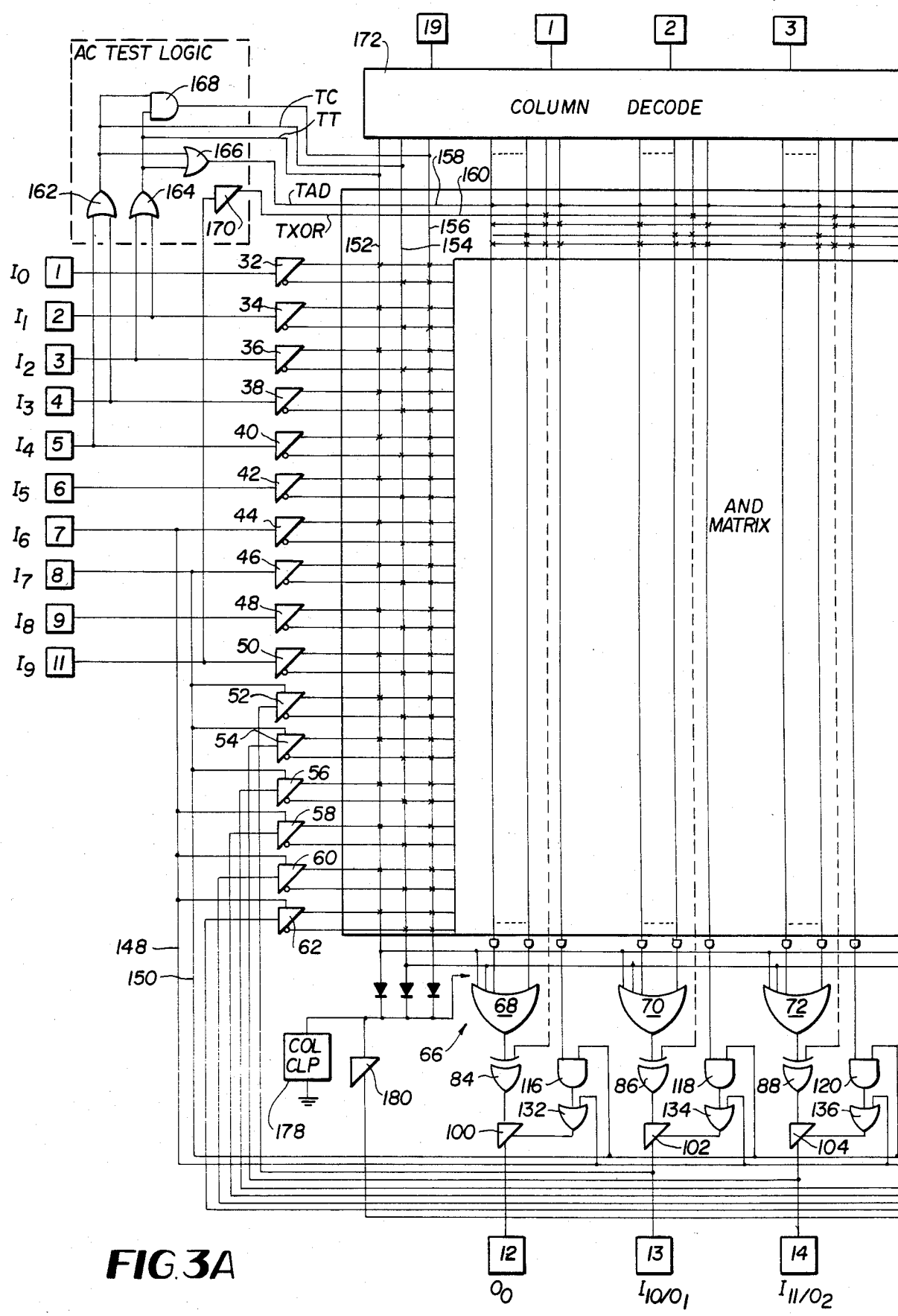
FIGS. 3A and 3B are block diagrams illustrating the principles of the present invention applied to a PAL.

A logic array incorporating the principles of the present invention is illustrated in FIG. 2 as including the AND array 12 and the OR array 18. In addition to the plurality of input buffers 14 and the output buffers 20, there are included a plurality of exclusive OR gates 28 each receiving as one of inputs an output from the OR gate 18 and having a second input connected to a fixed voltage VF. As is well-known, the value of the fixed voltage VF, whether it is logic high or a logic low, will determine whether the exclusive OR gate 28 is merely a buffer or an inverting buffer. To be more specific, if the fixed voltage VF is a logic high, the output signal of the OR matrix 18 is inverted at the output of the exclusive OR. If the fixed voltage VF for the individual exclusive OR is a logic low, the output of the OR matrix is transmitted at that logic level. The logic array 10 at this point is that of the prior art.

The addition for the present invention include an additional input line parallel to the other input lines to the AND matrix 12 to disable the AND matrix. This input line is illustrated as line 22 having a test AND matrix disabled singal TAD applied thereto. The AND disabled line 22 is connected to each of the AND gates of the AND matrix 12 and when a logic low TAD signal is applied to line 22 all the AND gates of the logical AND matrix 12 are disabled providing logic low outputs to line 16 to the OR matrix 18. Thus, the disabling of the logical AND matrix 12 not only disables the AND matrix 12 but disables the OR matrix 18 since it has logic low inputs. The disabling of the AND matrix allows testing before and after programming of the AND and/or OR matrix since the specific structure of the AND and OR matrix are not in the testing path.

A second line 24 connects each of the true outputs of the input buffer to each of the outputs of the OR matrix 18. Similarly, a third line 26 connects all the complement outputs of the input buffers 14 to each of the outputs of the OR matrix 18. A test true singal TT is applied to line 24 and a test complementary signal TC is connected to line 26 to enable the test signals applied to the input buffers $I_o$–$I_m$ to be provided to the output circuitry. Although the connections of lines 24 and 26 are shown as connected to each OR gate in the OR matrix, they may be connected to a separate OR gate to be combined with the functional OR gates of the matrix 18 or directly to the output of the OR matrix 18. The important distinction is that they are connected to the OR gate input to the exclusive OR gates 28. Connected to the second inputs to the exclusive OR gates 28 is a line 30 which receives an exclusive OR test signal TXOR. This allows the testing of the individual exclusive OR gates 28.

It should be noted that if the AND matrix and/or OR matrix is programmable, the connection of the true and complement test lines 24 and 26 with the output of the input buffers and/or the OR matrix should be by a programmable element so that the A.C. test path more accurately models the operational path which would be through the AND and OR matrices.

A test begins with providing the AND matrix disabled signal TAD to line 22 which disables the AND matrix. Next, the input and output buffers would be connected with either the true or complement lines 24 and 26. Assuming that the true line 24 is activated by a TT signal, then each of the individual input buffers 14 have a logic high and a logic low signal sequentially applied thereto while the other buffers are held in a non-interferring logic state. For each applied signal, the output of output buffers 20 will be monitored to determine whether the output is first a logic high and then a logic low. After each of the input buffers 14 have been separately tested through the high/low transition, the true line 24 is deactivated and the complementary line 26 is activated by test signal TC. The input buffers 14 are then individually and sequentially provided with a logic high and a logic low signal and the output buffers are monitored to see whether a logic low and then a logic high signal is present.

To test the exclusive ORs 28, either the true or complementary line 24 or 26 may be activated and one of the input buffers may be activated to provide an input signal on the first input of the exclusive OR gates 28. The exclusive OR test signal TXOR is provided to line 30 and the outputs are monitored to determine whether the outputs of the individual exclusive OR gates have changed from a logic high to a logic low. Thus, it can be seen that by the addition of additional lines 22, 24, 26 and 30, the input and output buffers as well as exclusive OR gates may be separately and individually tested independent of the AND matrix 12 and the OR matrix 18. This allows A.C. testing of the circuitry as well as isolation of the defective parts. The generic logic array 10 of FIG. 2 may be a programmable logic array (PLA), a programmable array logic (PAL), or a programmable read-only memory (PROM).

Figure 3B:
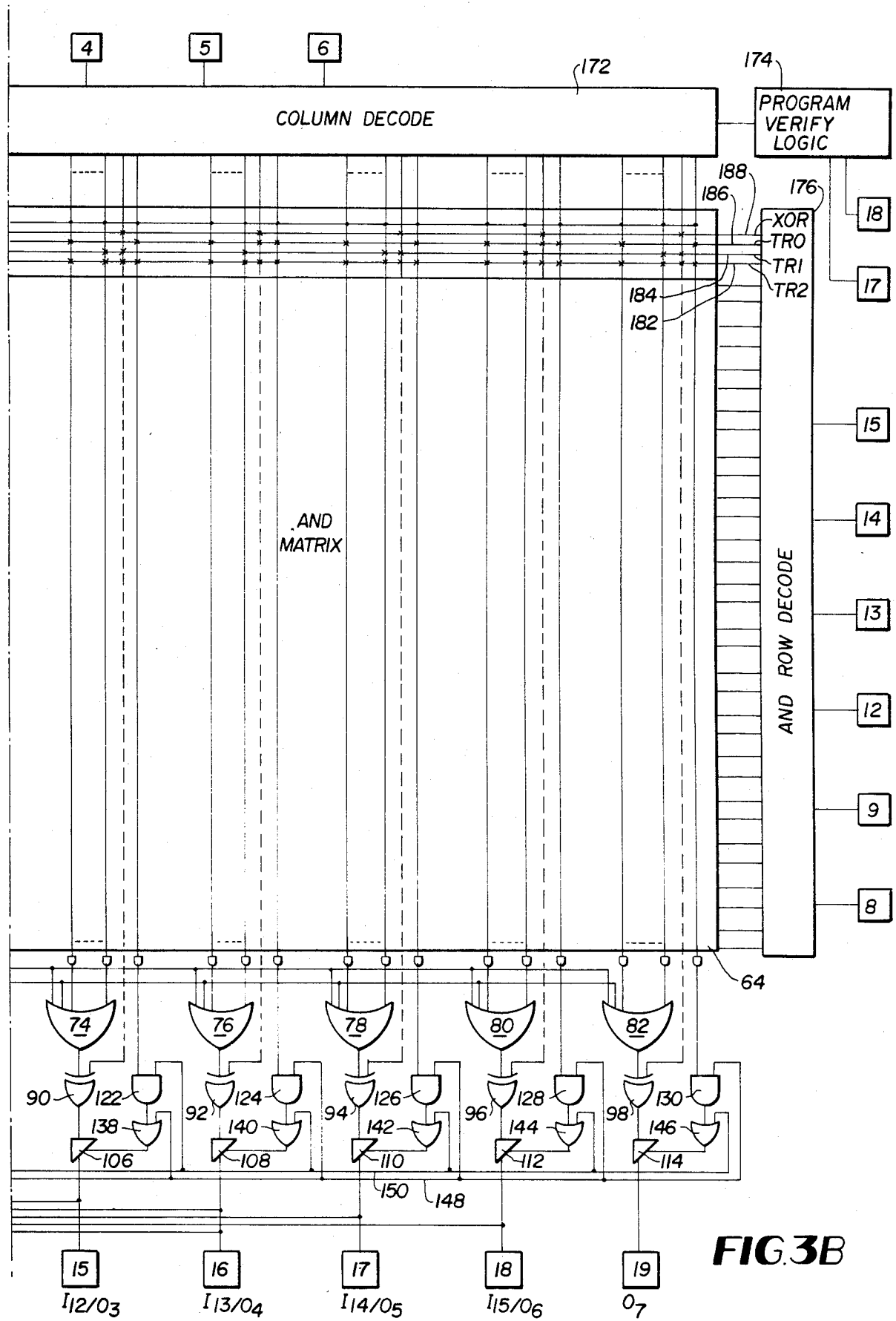

A specific application of FIG. 2 to a programmable array logic (PAL) is specifically illustrated in FIG. 3. The inputs $I_0$–$I_9$ are provided to input pins 1 through 9 and 11 which are connected directly to input buffers 32, 34, 36, 38, 40, 42, 44, 46, 48 and 50, respectively. Additional input buffers 52, 54, 56, 58, 60 and 62 receive the inputs from pins 13 through 18, respectively, whose input signals are $I_{10}$ through $I_{15}$. The true and complement lines of input buffers 32 through 62 are provided to the AND matrix 64 which is diagramatically illustrated as a box. The formation of the AND matrix may be any of the well-known structures and is not described in detail. The columns which are part of the AND matrix and are programmable are illustrated as solid lines terminating in an AND gate, and columns which are not part of the AND matrix, and are not progammable in the AND array, but physically or schematically are through the AND matrix are illustrated by dashed lines through the AND matrix.

The OR matrix 66 is illustrated as a plurality of OR gates 68 through 82. The outputs of the OR gates 68 through 82 are connected to a plurality of exclusive OR gates 84 through 98. The second input for the exclusive OR gates is from lines emanating from, but not part of the AND matrix 64. Connected to the output of the exclusive OR gates 84 through 98 are a plurality of output buffers 100 through 114. The outputs of output buffers 100 through 114 are connected to output pins 12 through 19, respectively, to provide output signals $O_0$ through $O_7$. The output of output buffers 102 through 112 are connected by lines to provide inputs to input buffers 52 through 62, respectively.

Since the pins 13 through 18 may be used as input or output terminals, control means are provided to deactivate the output buffers 102 through 112 when the terminals 13 through 18 are used as input pins. As will be explained more fully in the overall test sequence, this control circuitry is also provided for the output buffers 100 and 114. The circuitry includes AND gates 116 through 130 and OR gates 132 through 146 for the respective output buffers 100 through 114. The AND gates have one input from the AND matrix 164 which will control the activation of the output buffer as a function of the programming of the AND matrix 64 and a second input which will selectively disable the AND gate 116 and the output buffer under test control. The OR gate includes an input from the output of the AND gate and a second input which will enable the output buffer under test control. Without the test control signal of the present invention, the signal from the AND matrix will be directly connected to the output buffers 100 through 114 to control activation/deactivation.

Lines 148 and 150 connect the pins 7 and 8 as enable and disable inputs to the OR gates 132 through 146 and the AND gates 116 through 130. The first four AND gates 116 through 122 are connected to the line 150 and the OR gates 132 through 138 being connected to line 148. The second four AND gates 124 through 130 are connected to line 148 with the respective OR gates 140 through 146 being connected to line 150. Thus, with the logic low on line 150 and a logic high on line 148, OR gates 132 through 138 are activated by the high on line 148 to turn on output buffers 100 through 106 and the OR gates 140 through 146 receive no input signal from logic low line 150 and, thus, output buffers 108 through 114 are deactivated.

It should also be noted that input buffers 52, 54 and 56 are connected to and controlled by line 150 and buffers 58, 60 and 62 are connected to and controlled by lines 148. The connection of line 150 to enable the input buffers 52, 54 and 56 is in opposition to its commonly connected output buffer 102, 104 and 106 which are activated by lines 148. Similarly, input buffers 58, 60 and 62 are being activated by line 148 which is in opposition to their respective output buffers 108, 110 and 112 which are activated by lines 150. Either line 149 or 150 are activated to a logic high at a time such that the output buffers are tested in groups of four and the respective input buffer which is commonly connected to an input/output pin is deactivated.

Lines 152 and 154 which appear as columns in FIG. 3 are connected, respectively, to the true and complement output of the input buffers 32 through 62 by programming elements signified by an "X" and are connected to each of the OR gates 68 through 82. By using a programmable connection, which is not programmed, a model of the operational signal path through the AND matrix is possible during the A.C. test. Although they are shown connected directly to the OR gates 68 to 82, they may be connected directly to the exclusive ORs 84 through 98. An additional column line 156 which is connected by a programmable connection is also provided connected to both the true and complement output of each of the input buffers 32 through 62. Line 156, as is well known, is used for the AND matrix row decoder verification and programming capability to be discussed below. An additional input row is illustrated as line 158 connected to each of the column inputs to the OR gate through the AND matrix and receives the AND matrix disable test signal TAD and a second additional row 160 is provided connected to each of the exclusive OR columns and receives the test exclusive OR signal TXOR. The true test signal TT is connected to line 152 and the complementary test signal TC is connected to line 154.

The convention used in FIG. 3 is that an "X" represents a programmable connection and a "dot" represents a hard wire connection which may be an unexercised programmable connection. The AC test logic includes OR gates 162 and 164 which receive inputs from pins 4 and 5 and 2 and 3, respectively. The output of OR gate 162 generates the test complementary signal TC and is connected directly to line 154 and the output of OR gate 164 generates the test true signal TT and is connected directly to line 152. The outputs of the OR gates 162 and 164 are also connected to OR gate 166 which produces the AND array disabled signal TAD upon the receipt of either a TC or TT signal. The outputs of 160 and 164 are also connected to AND gate 168 whose output is provided directly to line 156. An input buffer 170 is connected to terminal 11 and provides the exclusive OR test signal TXOR to line 160. The OR gates 162 and 164 are provided such that the input buffer of pins 2, 3, 4 or 5, upon which a test enable signal is applied, may be later tested by providing the test enable signal on the other pin of the respective OR gate.

The test described above is performed by providing test signals on pins 2 or 3 which provides a test signal TT for the true outputs and the AND matrix disable TAD. With this special high logic signal provided on terminals 2 or 3 the other input terminals are activated one at a time to selectively test the input buffers 32 through 62 except for the 34 or 32 which receives the high test signal. The other pin then receives the high test signal so that the first input buffer can be tested. A high test signal is also provided on input pin 7 or 8 to selectively enable and disable the pairs of input and output buffers such that only one at a time is activated and may be individually tested. Next, the complement outputs are tested by activating pins 4 or 5 and repeating the sequence through the input buffers with the control of the equivalent combination input/output buffers such that only one of a respective pair are activated at a time. A test signal provided on pin 11 will activate the exclusive OR test signal TXOR such that the exclusive ORs 84 through 98 may be tested.

It should be noted that where a number for a pin is on more than one location on the drawing for FIG. 3 it indicates that a single pin may provide two different types of inputs. For the logic control in the A.C. test of the input and output buffers and the exclusive ORs, a test signal substantially higher than that normally used as an input to the array is used. For example, the normal TTL logic signal is below 5 volts wherein the control signals are 11 volts. Thus, the circuitry is capable of distinguishing between test control signals and normal operating signals. The circuitry which is used to implement the buffers and the OR gates are sized so as to receive and mix the appropriate signals.

Also shown in FIG. 3 and the AND matrix verification and programmability including column decoder 172 having inputs from pins 19 and 1 through 6, row decoder 176 having inputs from pins 8 and 9 and 12 through 15, program and verify logic 174 having inputs from pins 17 and 18, a column clamp 178 and an output buffer 180 both connected to all the columns in the AND array including 152, 154 and 156 by diodes as a single logical OR. Only the diodes for columns 152, 154 and 156 are shown for sake of clarity. The buffer 180 is connected to pin 16 to provide a single output from the AND matrix. As is well-known in the prior art, the test rows 182, 184, 186 and 188 are also provided. Row 182 is connected to all of the columns by a programmable connection. Row 184 is connected to one of the columns to each OR gate and 186 is connected to another column of each OR gate. Row 188 is connected by programmable connection as the input to the exclusive ORs. The programmable connection of 188 is programmed using the column decoder 172 and a row decoder 188 to determine whether the exclusive OR will be a straight gate or an inverter.

The column and row decoder verification procedure begins with activating, for example, column 152 which is the true output, addressing the individual rows by row decoder 176 and monitoring the output on pin 16 as the individual rows are decoded. This test is repeated by activating the complement line 154 and addressing the individual rows. The column decoder is verified in the exact same method using test rows 184 and 186 and individually sequencing or addressing the individual columns using the column decoder 172. The programmability of the matrix is tested by activating, for example, the test column 156 and individually addressing the individual rows and monitoring whether the programmable connection has been disrupted. The same test for the programmability of the columns is performed by activating test line 182 and programming using the column decoder 172. Clamp 178 is activated during the programming sequence. Once this has been verified, the system may be used to program the AND matrix using the program and verify logic 174 and the clamp 78. After the AND matrix has been programmed, it can be verified using the column and row decoders 172 and 176 and monitoring the output of pin 16.

Figure 4C:
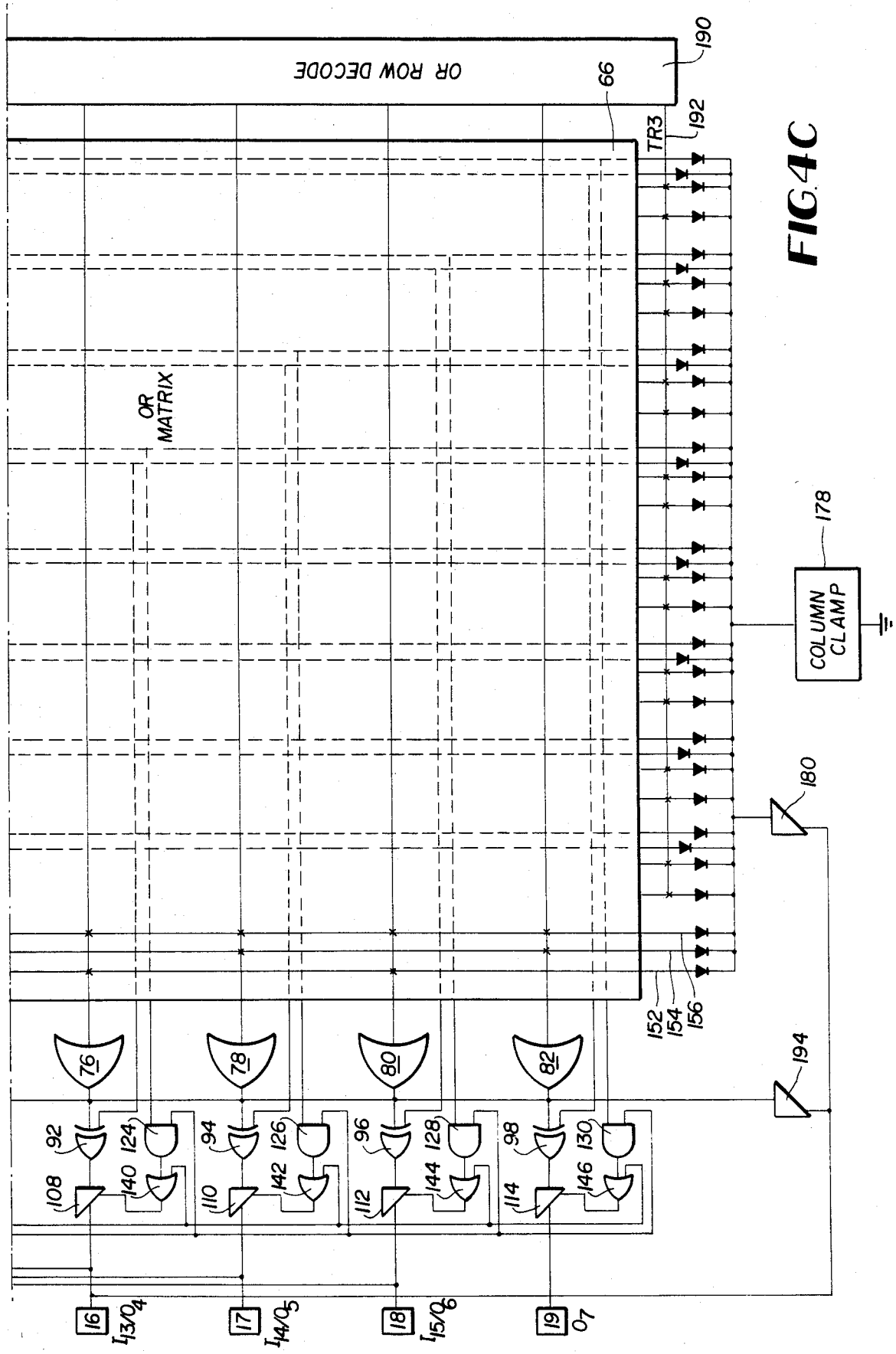

The implementation of FIG. 2 in a PLA is illustrated in FIG. 4. As with FIG. 3, the AND and OR matrices are indicated as boxes with lines which are not programmable and not part of the matrix as dashed lines. For example, the exclusive OR columns are not part of the AND matrix 64 (shown dashed) and are not part of the OR matrix 66 (shown dashed), whereas the control line for the AND gates 116 through 130 to control the output buffers 100 through 114 are programmable and part of the AND matrix 64 (shown solid) and not part of the OR matrix 66 (shown dashed). Since the OR matrix of the PLA is programmable, the connection of lines 152, 154 and 156 to the OR gates 68 through 82 are by programmable connections.

In addition to the AND row decoder 176, the PLA has an OR row decoder 190 with the same input pins. The test column 156 is programmably connected to each row of the OR matrix and the OR row decoder 190 selects the individual rows to test the programmability of the rows of the OR matrix as AND row decoder 176 does for the AND matrix 14. A fourth test row, TR3, 192 is selected to the OR row decoder 190 and is connected by a programmable connection to each of the columns of the OR matrix. As with test row TR2, this allows verification of the programmability of the columns of the OR matrix 16. In addition to sense amplifier 180 which provides a single output from the AND matrix at pin 16, sense amplifier 194 is connected to the output of the OR gates 68 through 82 to provide a single output on pin 16.

The A.C. testing of the PLA of FIG. 4 is the same as that for the PAL of FIG. 3 as thus will be not be repeated.

From the preceding decription of the preferred embodiments, it is evident that the objects of the invention are attained in that a new method and simple structure is provided for A.C. testing the input and output circuitry of a logical array. Although the invention has been described and illustrated in detail, it is clearly understood that the same is by way of illustration and example only and is not to be taken by way of limitation. The spirit and scope of the present invention are to be limited only by the terms of the appended claims.

Although the true and complement outputs of the input buffers are shown connected to true test line 154 and complement test line 156, respectively, the true and complement outputs of each input buffer may be connected to either test line as long as the true and complement outputs of any one input buffer are not connected to the same test line. This is true for all of the figures shown.

What is claimed is:

1. In a logic array including a logical AND matrix, a plurality of input buffer means having a true and a complement output connected to the input of said logical AND matrix, a logical OR matrix connected to the output of said logical AND matrix and a plurality of output buffer means connected to the output of said logical OR matrix, the improvement comprising testing means for testing said input and output buffer means including:
  means for disabling said logical AND matrix in response to a first test signal;
  first means for connecting said true or complement output of each of said input buffer means to each of said output buffer means in response to a second test signal;
  second means for connecting said true or complement output, not connected by said first connecting means, of each of said input buffer means to each of said output buffer means in response to a third test signal;
  whereby said input and output buffers are tested by providing said first and either said second or third test signals, addressing said input buffer means and monitoring the output of said output buffer means.

2. The logic array according to claim 1, wherein the output of at least one selected output buffer means is connected to the input of a selected input buffer means, and including means for enabling either said selected input buffer means or said selected output buffer means and disabling the other in response to a fourth test signal.

3. The logic array according to claim 2 including means for disabling said selected output buffer in response to a preselected output of said logic AND matrix.

4. The logic array according to claim 1, wherein said output buffer means includes an exclusive OR gate having a first input connected to the output of said OR matrix and a second input connected to a preselected logic level and an output buffer connected to the output of said exclusive OR gate, and including means for providing logic level signals to said second input of said exclusive OR gate in response to a fifth test signal.

5. The logic array according to claim 1, wherein said AND matrix is programmable and said means for connecting said true and complement output of said input buffer means to said output buffer means includes programmable connections.

6. The logic array according to claim 5, wherein said OR matrix is programmable.

7. The logic array according to claim 1, wherein said OR matrix is programmable and said means for connecting said true and complement output of said input buffer means to said output buffer means include programmable connections.

8. The logic array according to claim 1, wherein said logical AND matrix includes a plurality of parallel input lines and a plurality of parallel output lines orthogonal to said input lines; and wherein said means for disabling said logic AND matrix includes an additional input line connected to each logic AND and said first test signal providing a logic low input to each logic AND to disable said logical AND matrix.

9. The logic array according to claim 1, wherein said logic AND matrix includes a plurality of parallel input lines and a plurality of parallel output lines orthogonal to said input lines; wherein said means for connecting said true output of said input buffers to the input of said output buffers includes a first additional output line; and wherein said means for connecting complement output of said input buffers to the input of said output buffers includes a second additional output line.

10. The logic array according to claim 1, including means for generating said first test signal in response to either said second or third test signal.

11. A method for testing the input and output circuitry of a logic array having a logical AND matrix whose input is connected to said input circuitry and a logical OR matrix whose input is connected to the output of said logical AND matrix and whose output is connected to said output circuitry comprising the steps of:

disabling said logical AND matrix;
connecting all the true outputs of the plurality of buffers of the input circuitry to each of the inputs of the output circuitry;
individually activating the input buffers to a true output and monitoring the outputs of the output circuitry;
connecting all the complement outputs of the plurality of input buffers to each of the inputs of the output circuitry; and
individually activate the input buffers to a complement output and monitoring the outputs of the output circuitry.

12. The method according to claim 11, wherein at least one selected output of the output circuitry is connected as a selected input to said input circuitry; and including the steps of enabling said selected input while disabling said selected output and subsequently enabling said selected output while disabling said selected input.

13. The method according to claim 11, wherein sid output circuitry includes for at least one output an exclusive OR gate having a first input connected to the output of said logical OR matrix and a second input and an output buffer connected to the output of said exclusive OR; and including the steps of providing a test signal to said second input and monitoring the output of said output buffer.

* * * * *